United States Patent [19]

Turner

[11] 4,166,783
[45] Sep. 4, 1979

[54] DEPOSITION RATE REGULATION BY COMPUTER CONTROL OF SPUTTERING SYSTEMS

[75] Inventor: Frederick T. Turner, Sunnyvale, Calif.

[73] Assignee: Varian Associates, Inc., Palo Alto, Calif.

[21] Appl. No.: 897,235

[22] Filed: Apr. 17, 1978

[51] Int. Cl.² .............................................. C23C 15/00
[52] U.S. Cl. .................................. 204/192 R; 204/298
[58] Field of Search ............................. 204/192 R, 298

[56] References Cited

U.S. PATENT DOCUMENTS 4,043,889   8/1977   Kochel ............................. 204/192 R

FOREIGN PATENT DOCUMENTS 2422808  11/1975  Fed. Rep. of Germany ........... 204/298
2232832   2/1975  France ................................. 204/192 R
7237840   9/1972  Japan .................................... 204/298

*Primary Examiner*—John H. Mack
*Attorney, Agent, or Firm*—Stanley Z. Cole; Edward H. Berkowitz

[57] ABSTRACT

A sputtering system utilizes a computer to monitor the power dissipation in the sputtering source and to accumulate the history of usage of the particular sputtering target. Desired deposition rate information is input to the computer, which establishes and maintains the desired rate and controls the plasma discharge to compensate for aging and deterioration of the target. End of useful target life is determined by the computer from objective criteria to trigger appropriate actions.

7 Claims, 3 Drawing Figures

DEPOSITION RATE REGULATION BY COMPUTER CONTROL OF SPUTTERING SYSTEMS

BACKGROUND OF THE INVENTION

The present invention involves an improved sputtering system, computer controlled to compensate for both long term and short term deviations from desired performance.

In the deposition of thin films, control of parameters such as film thickness, uniformity and the like are of critical importance. For most coating applications, and particularly in a production context, sputtering techniques have proven to be advantageous in achieving desired specifications for a wide variety of materials. It is known, however, that certain components of sputter coating apparatus are subject to deterioration; for example, the target (cathode), which is the source of sputterant, erodes under ion bombardment in such fashion as to significantly alter the geometry of the cathode surfaces during the useful life thereof. U.S. patent application No. 805,485, now U.S. Pat. No. 4,100,055, assigned to the assignee of the present invention, discloses an improved initial cathode shape which yields a longer useful life and thus greater integrated mass transfer of sputterant than achieved in the prior art. It has been pointed out in the above-referenced application that the power dissipated in the plasma, as well as the cathode geometry, is subject to a dependence on cumulative usage of the particular cathode. It is apparent that the rate of deposition reflects a similar variation. In the prior art, an independent deposition rate monitor provided, a deposition rate signal for use in a feedback loop to control the excitation source of the plasma discharge.

A BRIEF DESCRIPTION OF THE PRESENT INVENTION

The present invention employs a digital computer to stabilize the sputtering rate at a desired level which is selected by operator input to the computer. The computer accomplishes this by regulating the operation of a closed loop system wherein the power dissipated by the excitation source is monitored from the current drawn from the cathode and the cathode-anode voltage. Moreover, the empirical relationship of deposition rate to the cumulative history of the type of cathode is retained by the computer and accessed by the computer to correct the power dissipated in the sputtering discharge in order to maintain the desired deposition rate from the presently installed cathode. The computer also monitors the cumulative history of the presently installed cathode in order to update this correction periodically. The desired deposition rate is obtained from information input to the computer independently and determines a reference level of deposition rate to which operation is stabilized. The computer determines from objective criteria based upon experience when the end of useful life for the particular cathode is reached and takes appropriate action in that event.

Accordingly, it is an object of the present invention to stabilize sputtering deposition rate at a desired value.

In one feature of the present invention the prior history of the specific cathode is accumulated and retained by a computer.

In another feature of the invention the power dissipated in the sputtering plasma discharge is monitored by said computer.

In yet another feature of the invention the operating parameters of the excitation source for said sputtering apparatus is controlled by said computer in response to the monitored power dissipated, the cumulative history of the sputtering cathode the pressure within the sputtering chamber and the desired rate of deposition.

In yet another feature of the invention the aging characteristics of the particular type of cathode are retained and accessed by said computer to correct the operation of the apparatus for the aging of the cathode then in use.

Other features and advantages of the present invention will become apparent upon a perusal of the following specification, taken in connection with the accompanying drawings wherein:

DETAILED DESCRIPTION OF THE PREFERRED EMBODIMENT

Figure 1:
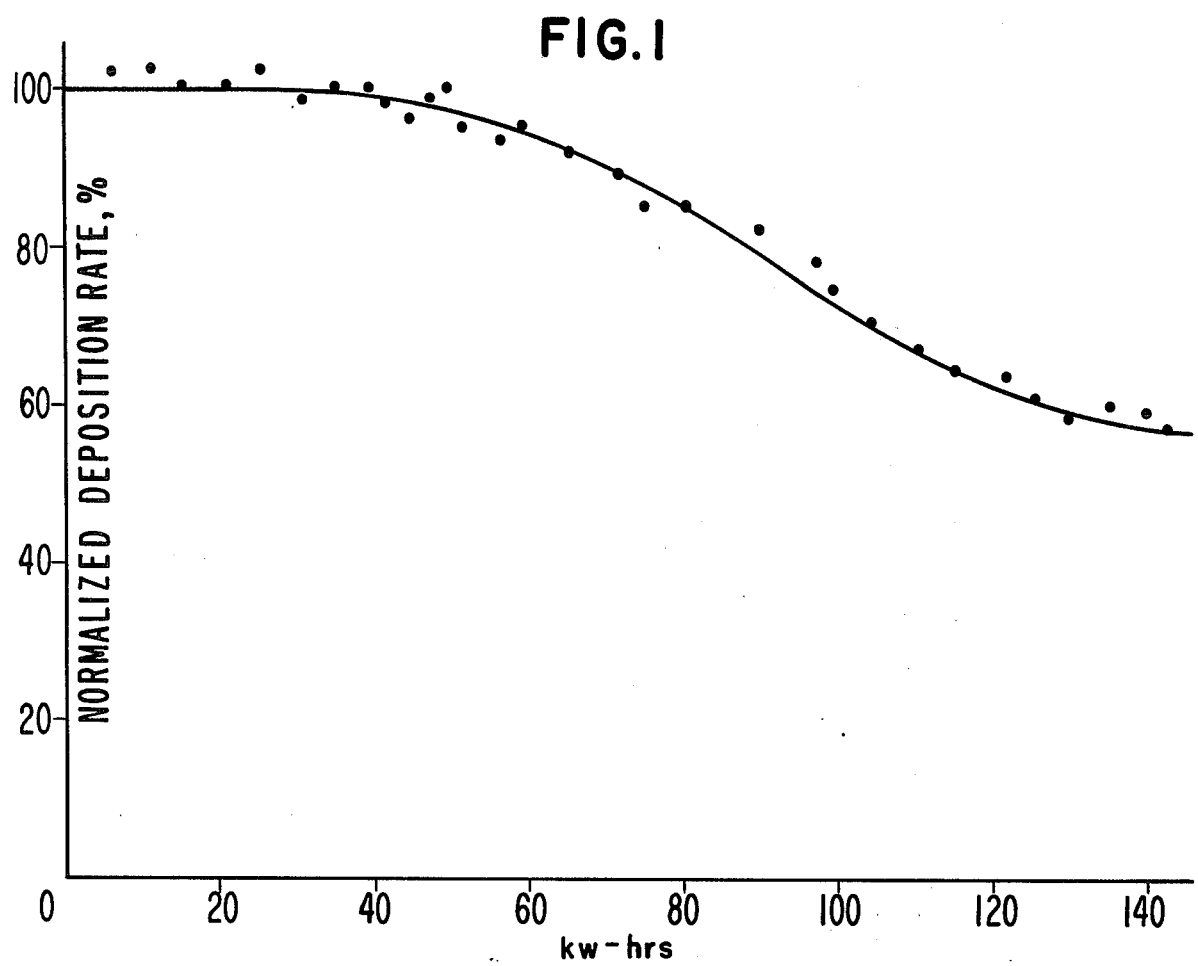
FIG. 1 depicts the aging characteristics of one type of sputtering target.

The sputtering process is initiated by the impact of positive ions, typically argon, on a cathode surface. The impact dislodges cathode material which deposits on the object to be coated. The source of positive ions is a plasma excited by the potential maintained between cathode and anode. In a well-known form a cathode structure surrounds a centrally disposed anode. The sputtering process inevitably erodes the cathode surface and the electrical characteristics are altered thereby. Consequently, the deposition rate for given operating conditions deteriorates. FIG. 1 is an empirical measurement of the performance of a cathode of given material and geometry such as the Varian model C 655859 in a Varian S-gun (TM) as a function of its cumulative operation expressed in kilowatt hours at constant pressure. The ordinate is the deposition rate per kilowatt normalized to the same parameter at an initial stage of usage. The data of FIG. 1 refer to constant pressure which is ordinarily independently monitored and regulated. The present invention is not limited to S-Gun systems and could be employed with magnetron sputtering sources as well.

Figure 2:
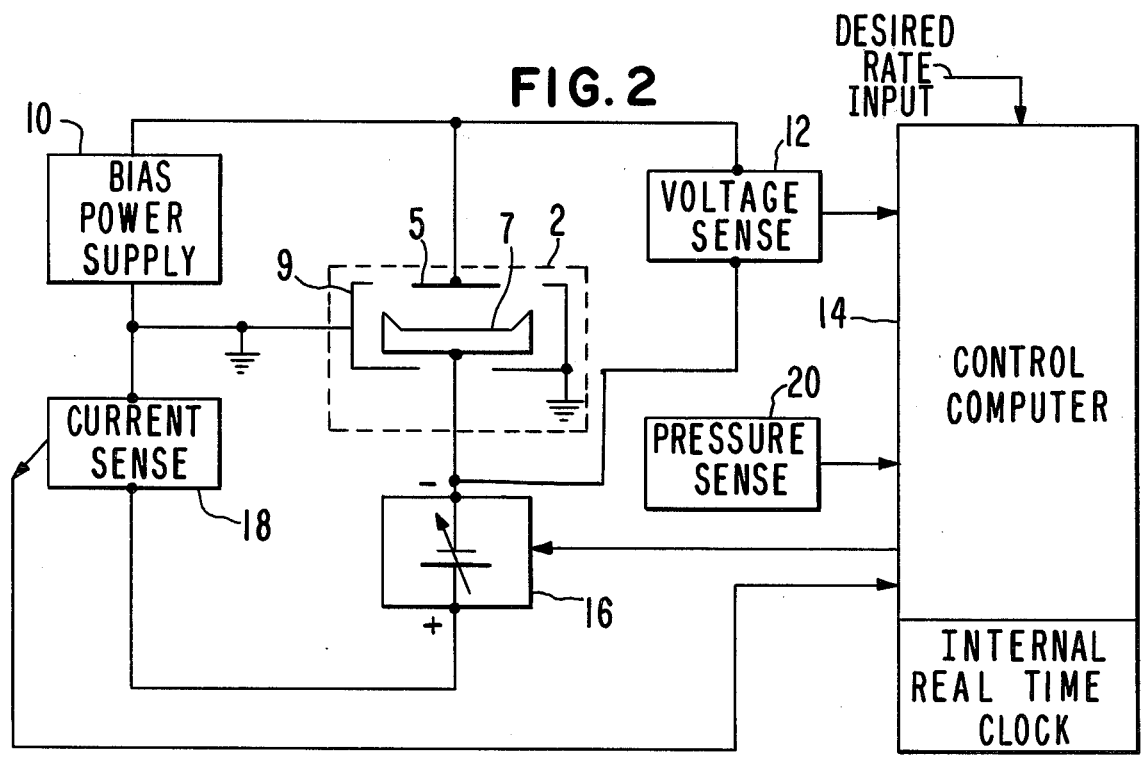
FIG. 2 is a schematic illustration of the system of the present invention.

A preferred embodiment of the present invention is schematically indicated in FIG. 2. A sputtering apparatus 2 comprises an anode 5 and cathode structure 7 with auxiliary structures 9. The latter include shield electrode and magnets for containing the plasma and directing the impacting ions. More detailed discussion of sputtering systems for coating applications may be found in Hoffman, Solid State Technology, Dec. 1976, pp. 57–66. The anode potential with respect to ground is maintained by a bias supply 10 and the cathode-anode voltage is monitored by voltage sensor 12. The anode potential vs. ground is typically maintained at a value of +40 volts. Voltage sensor 12 is preferably a digital volt meter which may be interrogated by digital computer 14.

The cathode current is supplied by variable current power supply 16 which maintains the cathode at a low potential with respect to ground. Typically the cathode is maintained in a range of about 400-1000 volts negative with respect to ground and may draw currents ranging from 3 A to 10 A in accord with the desired deposition rate and the age of the particular cathode among other parameters. The cathode current is sensed by current sensor 18 which is also monitored by computer 14. The current drawn from cathode supply 16 is controlled by computer 14 in response to the power dissipated in the plasma, the cumulative usage of the particular target, the pressure and the desired deposition rate.

Figure 3:
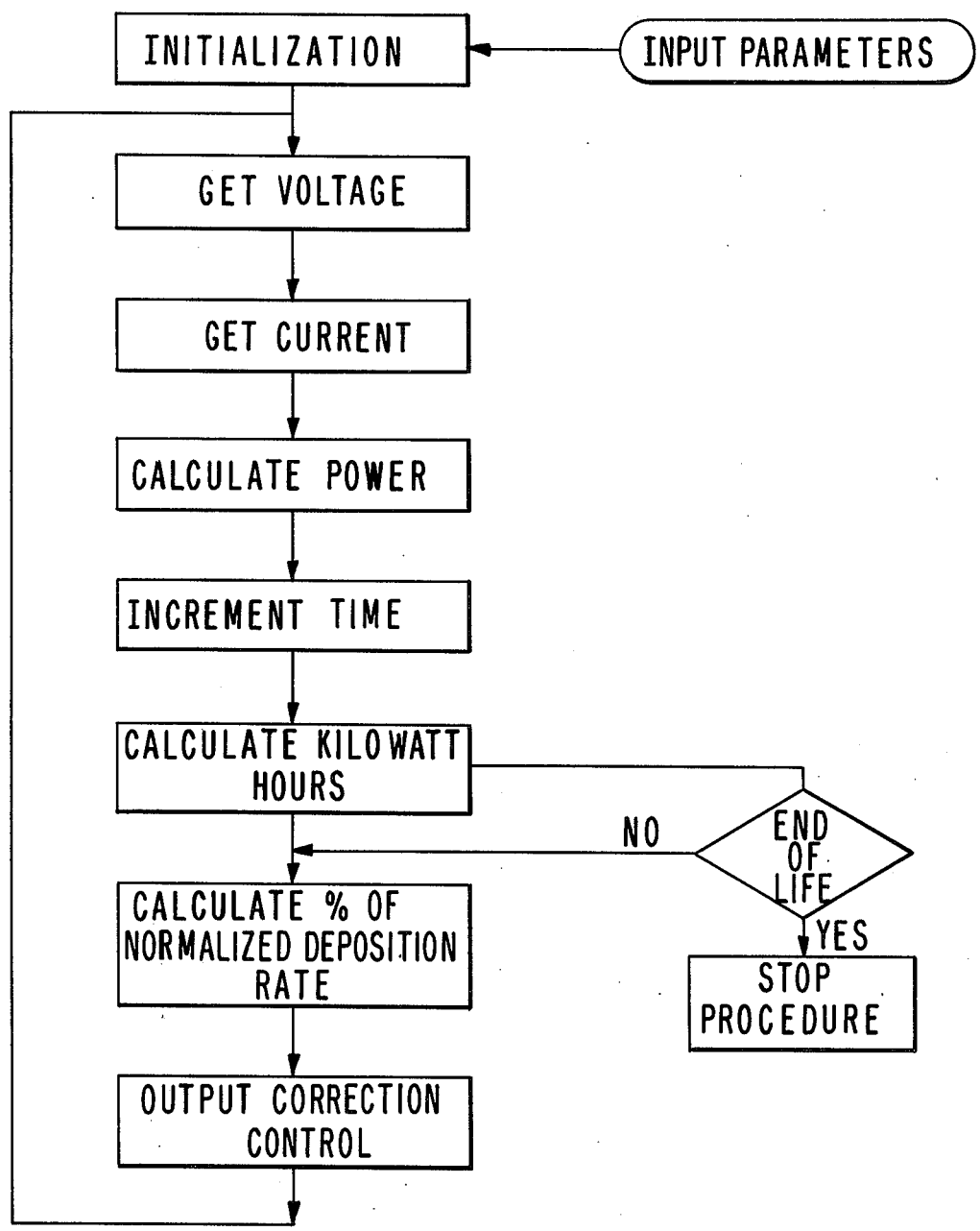
FIG. 3 is a flowchart of the computer routine for the present system.

The computer 14 is first employed to perform certain initialization computations. For example, in a production context an operator specifies the material and thickness of coating desired and throughput of object to be coated. The computer determines the deposition rate and the initially required power in view of the elapsed usage of the particular cathode and controls the system accordingly. Thereafter, the operation of the digital computer is outlined conveniently by the flowchart of FIG. 3. The cathode anode potential and the current in the cathode-anode loop is obtained from sensors 12 and 18 and the power is calculated. The nature of the calculation performed is as follows. The deposition rate, power dissipation and the aging characteristic are expressed by an empirically obtained function specific to the cathode material which is stored in the computer;

$$f(P,r,\tau,\rho)=0$$

where P is the power, r is the deposition rate, $\tau$ is the integrated "age" of the cathode in kilowatt hours and $\rho$ is the pressure. For a desired rate R specified by the operator, the above equation may be solved to obtain the required power. This may be obtained by calculation using appropriate numerical techniques or by a table look-up. It will be apparent that this routine is executed outside the loop for initialization and inside the loop to correct the power for the usage of the cathode. The duration of cathode usage is incremented and the kilowatt hours of use updated accordingly, preferably by reference to the internal real time clock of computer 14. When the usage of the cathode exceeds a predetermined amount the computer branches to a stop condition. In normal course the elapsed kilowatt hours of usage is used to access an aging function stored in the computer, which function is peculiar to the type of cathode employed. A correction factor is then obtained for altering the current control of cathode power supply 16. Program control then returns to the top of the loop.

Pressure sensing apparatus 20, monitors the pressure in the neighborhood of the plasma discharge. The pressure dependence of equation 1 may be explicitly compensated or, alternatively, the pressure may be maintained constant at a desired value by an independent servo-loop. The latter is most commonly accomplished by regulating the plasma gas supply in relationship to the pumping speed of the vacuum pumps of the system.

It is appreciated that the stop condition may include initiating operation of another sputtering source or altering production parameters such as the time for which the workpiece is to be subject to coating. Other measures consistent with a stop condition will readily occur to one skilled in the production coating arts.

The present apparatus does not employ a deposition rate sensor to complete the feedback loop. The sputtering source itself provides sufficient information to the computer to permit regulation and correction. Thus, in a system comprising a plurality of sputtering sources regulated by a single computer, it is therefore not required to provide another plurality of deposition rate monitors for local monitoring of the sputtering sources. Because of the complexities of deposition rate monitors, great economics are thereby achieved in eliminating such monitoring apparatus and reducing the data handling requirements of the computer.

From the foregoing it will be seen that the present invention provides a useful method and apparatus for stabilizing deposition rate of sputterant from a sputtering apparatus without the direct monitoring of deposition rate by a deposition rate sensor. It will be understood that many modifications of the structure of the preferred embodiment will occur to those skilled in the art, and it is understood that this invention is to be limited only by the scope of our claims.

What is claimed is:

1. In a sputtering system comprising
   a cathode and an anode spaced from said cathode,
   controllable excitation means for supporting a plasma discharge between said cathode and said anode,
   means for monitoring the power dissipated in said discharge,
   means for monitoring the duration of operation for said cathode, and
   computation means for continuously correcting said excitation means in response to a function of said duration and said power for maintaining the deposition rate of material at a selected value.

2. The apparatus of claim 1 comprising hermetic envelope means for containing a desired gas in the region of said discharge.

3. The apparatus of claim 2 wherein said function has dependence upon the pressure of said gas and said system further comprises means for monitoring said pressure.

4. The apparatus of claim 3 wherein said computation means includes means for correcting said excitation means in response to said pressure dependence whereby said deposition is maintained at said selected value.

5. In a sputtering apparatus having a cathode and an anode in a hermetically sealed enclosure and means for maintaining a discharge between cathode and anode, the method of maintaining the sputtering deposition rate of such apparatus at a related value comprising the steps of,
   introducing a selected gas into the enclosure to a desired pressure,
   maintaining a plasma discharge between anode and cathode,
   logging the cumulative usage time during which said cathode is subject to discharge,
   sensing the parameters of said discharge, said parameters comprising the current drawn from said cathode and the potential difference between said cathode and anode,
   computing the power dissipated in said discharge,
   correcting a parameter of said discharge in accord with a function relating deposition rate, cumulative usage time, and said power, whereby said deposition rate is compensated for deterioration of the cathode.

6. The method of claim 5 wherein said function exhibits dependence upon the pressure in said enclosure and the parameters of said discharge further include said pressure.

7. The method of claim 6 wherein said step of correcting includes said pressure dependence.

* * * * *